US005585689A

United States Patent [19]

Imura et al.

[11] Patent Number: 5,585,689
[45] Date of Patent: Dec. 17, 1996

[54] FIELD-EMISSION CATHODE HAVING INTEGRATED ELECTRICAL INTERCONNECTS AND ELECTRON TUBE USING THE SAME

[75] Inventors: Hironori Imura; Hideo Makishima, both of Tokyo; Yoshinori Tomihari, Shiga, all of Japan

[73] Assignee: NEC Corporation, Japan

[21] Appl. No.: 606,496

[22] Filed: Feb. 23, 1996

Related U.S. Application Data

[63] Continuation of Ser. No. 364,967, Dec. 28, 1994, abandoned.

[30] Foreign Application Priority Data

Dec. 28, 1993 [JP] Japan ................................. 5-337428

[51] Int. Cl.⁶ ....................................................... H01J 1/30
[52] U.S. Cl. ............................................. 313/336; 313/309
[58] Field of Search ..................................... 313/309, 336, 313/351, 352; 315/169.4, 169.1

[56] References Cited

U.S. PATENT DOCUMENTS

| 4,393,127 | 7/1983 | Greschner et al. ............................ 430/5 |
| 5,075,595 | 12/1991 | Kane ............................................ 313/309 |
| 5,315,206 | 5/1994 | Yoshida ....................................... 313/309 |

FOREIGN PATENT DOCUMENTS

| 48-90467 | of 1973 | Japan . |
| 59-132149 | 7/1984 | Japan ........................... H01L 23/12 |
| 2-301142 | 12/1990 | Japan ......................... H01L 21/3205 |
| 3-104260 | 5/1991 | Japan ............................. H01L 21/90 |
| 5-307930 | 11/1993 | Japan ................................. H01J 1/30 |

OTHER PUBLICATIONS

Physical Properties of Thin–Film Field Emission Cathodes with Molybdenum Cones; Journal of Applied Physics, vol. 47, pp. 5248–5263.

Primary Examiner—Michael Horabik
Assistant Examiner—Michael Day
Attorney, Agent, or Firm—Ostrolenk, Faber, Gerb & Soffen, LLP

[57] ABSTRACT

A field emission cathode includes a conductive substrate (1) having emitters (4) formed thereon, a contact hole (5) extending therethrough, and a conductive layer (7) formed within the contact hole (5) thereby extending through the conductive substrate (1). A gate electrode (3) and the conductive layer (7) are insulated from the conductive substrate (1) by an insulating layer (2). The gate electrode (3) is connected to a first pull-out electrode (6) via the conductive layer (7), and the emitters (4) are connected to a second pull-out electrode (8) via the conductive substrate (1) thereby eliminating the need for bonding wires.

8 Claims, 11 Drawing Sheets

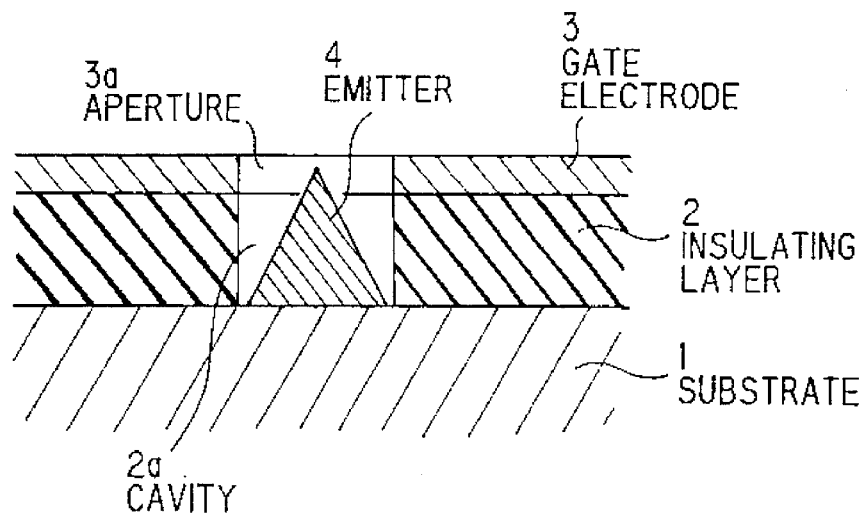
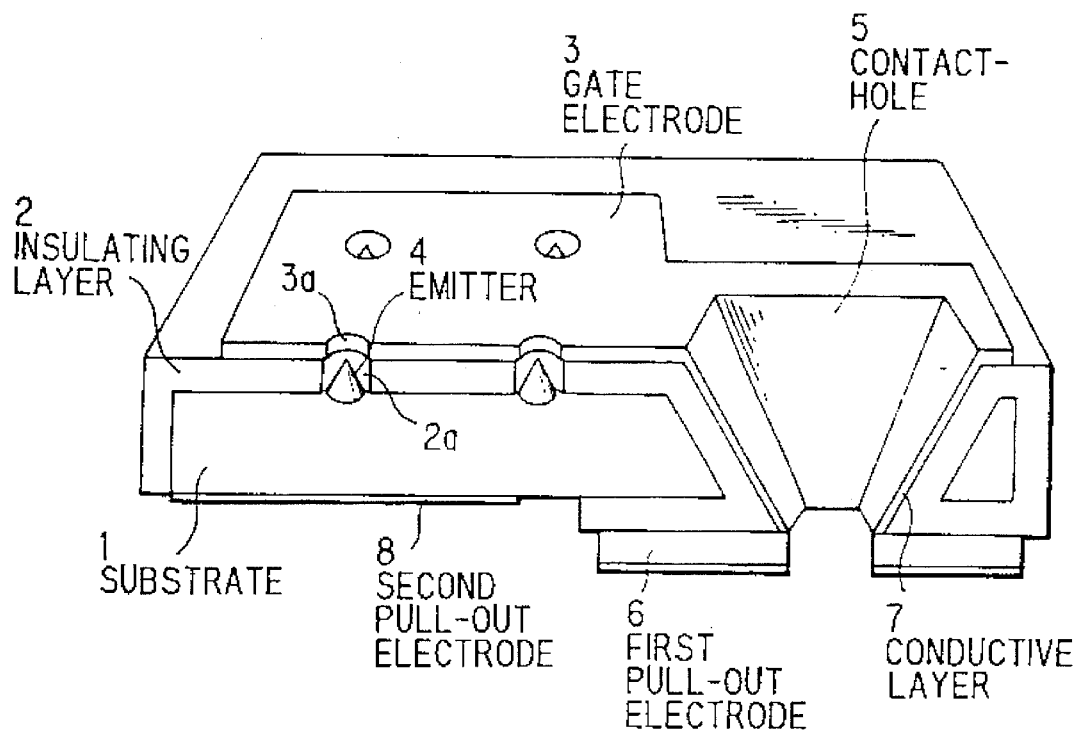

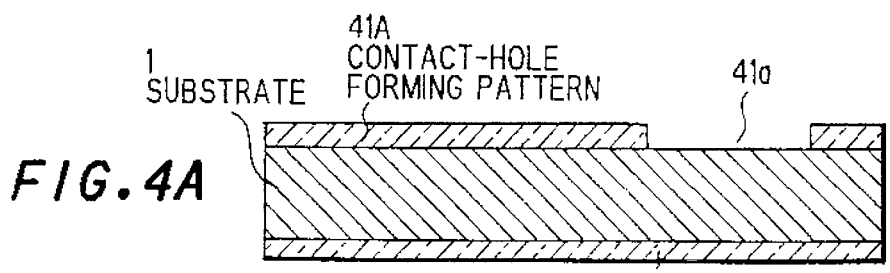
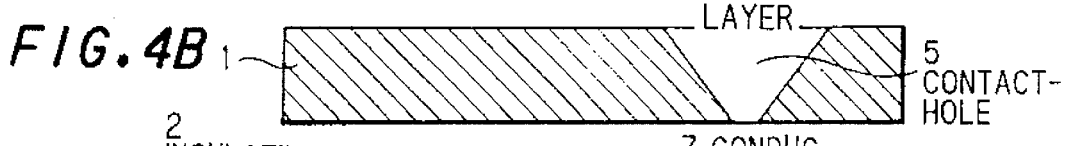
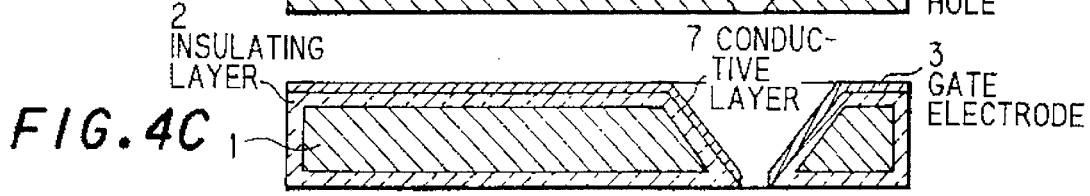
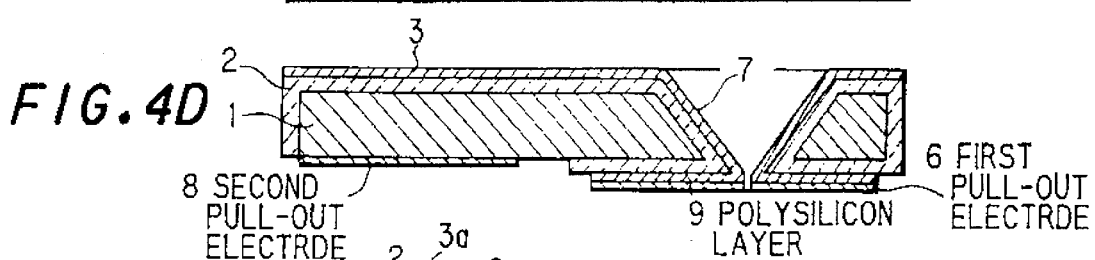
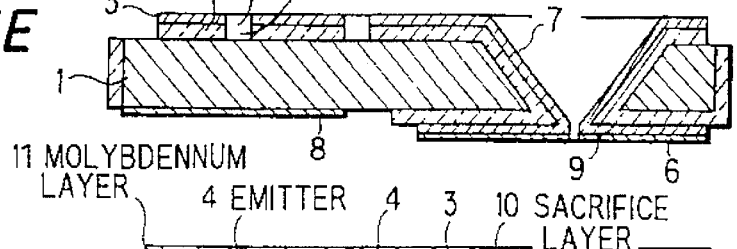
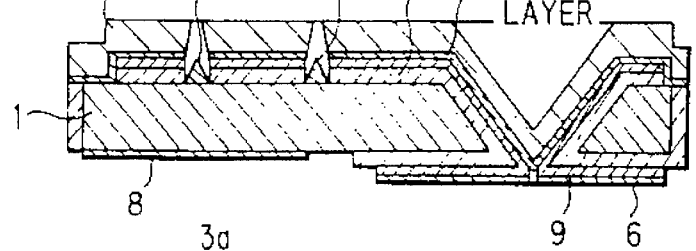
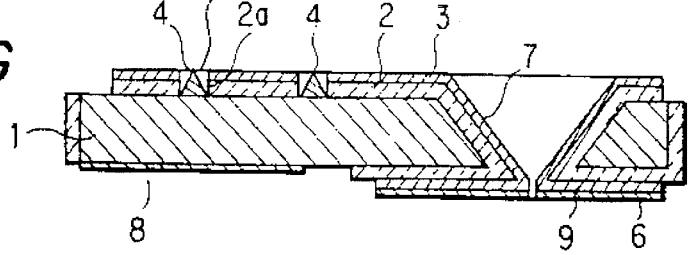

FIELD-EMISSION CATHODE HAVING INTEGRATED ELECTRICAL INTERCONNECTS AND ELECTRON TUBE USING THE SAME

This is a Continuation of application Ser. No. 08/364,967, filed on Dec. 28, 1994, now abandoned.

FIELD OF THE INVENTION

The invention relates to a field-emission cathode and an electron tube using the same, and more particularly to, a field-emission cathode having no need to bond a wire to a gate electrode and an electron tube using the same.

BACKGROUND OF THE INVENTION

A conventional field-emission cathode has been proposed on pages 5248 to 5263 of "Journal of Applied Physics, Vol. 47, No. 12, 1976" by C. A. Spindt et al. The conventional field-emission cathode comprises a silicon substrate, an insulating layer of 1 μm thickness formed on the silicon substrate, a gate electrode of molybdenum formed on the insulating layer, cone-shaped emitters of molybdenum having a height of 1 μm provided in cavities of 1.5 μm diameter formed through the insulating layer and the gate electrode, wherein the emitters are ohmic-contacted with the silicon substrate. In the field-emission cathode, the emitters are arranged in a predetermined pattern.

In operation, a voltage of several tens to 200 V is applied across the gate electrode and the silicon substrate, such that the gate electrode is at a positive potential to generate an electric field of more than $10^7$ V/cm at the tips of the emitters. Thus, electrons are emitted from the tip of the emitters.

In the field-emission cathode, emitted electrons of more than 100 μA are observed per one emitter to make it possible that it can be applied to a variety of applications. For instance, the fabrication of a switching device using a triode comprising the field-emission cathode as an electron source, and a display panel in which fluorescent spots are illuminated by electrons emitted from a planar electron source having matrix-arranged field-emission cathodes have been conducted. In this regard, the Japanese Patent Kokai No. 48-90467 discloses a color picture tube having an electron emission source structured by one or matrix-arranged field-emission cathodes in place of conventional thermal cathodes.

In such an electron emission source, a bonding wire or a bridge-shaped conductive member is ohmic-contacted to a gate electrode, so that a voltage is applied across the gate electrode and a substrate.

In an electron beam-application device or machine using such an electron source, it is required that an electric field (equipotential surface) generated above the electron source is vertical to the electron source and axis-symmetrical relative to a normal extending through an electron emitting center to focus or control the emitted electrons. Therefore, the bonding wire must have a sufficient distance from an electron emission surface, or must be shielded by a conductive member, so that the electric field is not disturbed.

Such a structure makes a gate electrode and an electron source large, so as to lower design freedom of the electron source. Even worse, making the gate electrode large makes a capacitance between the gate electrode and the substrate, so as to hinder high-frequency operation. Further, the bonding wire is bonded at both ends to the gate electrode and a power supply potential area, respectively so that reliability is lowered in regard to thermal impact and vibration shock.

In forming a contact-hole communicating from the top surface to the bottom surface of a substrate for a gate electrode to be pulled on the back surface thereof opposite to an electron emission plane, an ion-milling process, or a reactive-ion etching process, etc. is used. However, these processes taken a long time. In addition, the process is difficult in that a fine and thin conductive member is deposited on an inner wall of the contact-hole.

SUMMARY OF THE INVENTION

Accordingly, it is an object of the invention to provide a field-emission cathode and an electron tube using the same in which no bonding wire is necessary for a gate electrode to be connected to a power supply or voltage source.

It is a further object of the invention to provide a field-emission cathode and an electron tube using the same in which a large size is avoided, and increased capacitance between a gate electrode and a substrate is avoided.

It is a still further object of the invention to provide a field-emission cathode and an electron tube using the same, especially with which reliability is maintained in regard to thermal impact and vibration shock.

It is a yet further object of the invention to provide a field-emission cathode and an electron tube using the same in which a contact-hole is formed without taking a long time.

It is an additional object of the invention to provide a field-emission cathode in which a fine and thin conductive film is deposited on an inner wall of a contact-hole of a substrate.

According to the first feature of the invention, a field-emission cathode, comprises:

a substrate being conductive at least on a first surface thereof;

a gate electrode provided on the first surface of the substrate and insulated from the substrate, the gate electrode having one or more apertures;

one or more emitters provided on the first surface of the substrate, the emitters having sharpened tips to be surrounded by the apertures of the gate electrode;

a contact-hole provided through the substrate;

a power supply electrode provided on a second surface of the substrate and insulated from the substrate; and a conductive member provided on an inner wall of the contact-hole and insulated from the inner wall to connect the gate electrode to the power supply electrode.

According to the second feature of the invention, an electron tube, comprises:

an electron emission source for emitting electrons; and a unit for collecting the electrons emitted from the source via an electron path;

wherein the source, comprises:

a substrate being conductive at least on a first surface thereof;

a gate electrode provided on the first surface of the substrate and insulated from the substrate, the gate electrode having one or more apertures;

one or more emitters provided on the first surface of the substrate, the emitters having sharpened tips to be surrounded by the apertures of the gate electrode;

a contact-hole provided through the substrate;

a power supply electrode provided on a second surface of the substrate and insulated from the substrate; and a conductive member provided on an inner wall of the contact-hole and insulated from the inner wall to connect the gate electrode to the power supply electrode.

BRIEF DESCRIPTION OF THE DRAWINGS

The invention will be explained in more detail in conjunction with appended drawings, wherein:

FIG. 1 is a cross-sectional view showing a conventional field-emission cathode;

FIG. 2 is a perspective and cross-sectional view showing a field-emission cathode in a first preferred embodiment according to the invention;

FIGS. 4A to 4G are cross-sectional views showing how a field-emission cathode in the first preferred embodiment is fabricated;

DESCRIPTION OF THE PREFERRED EMBODIMENTS

Figure 3A:
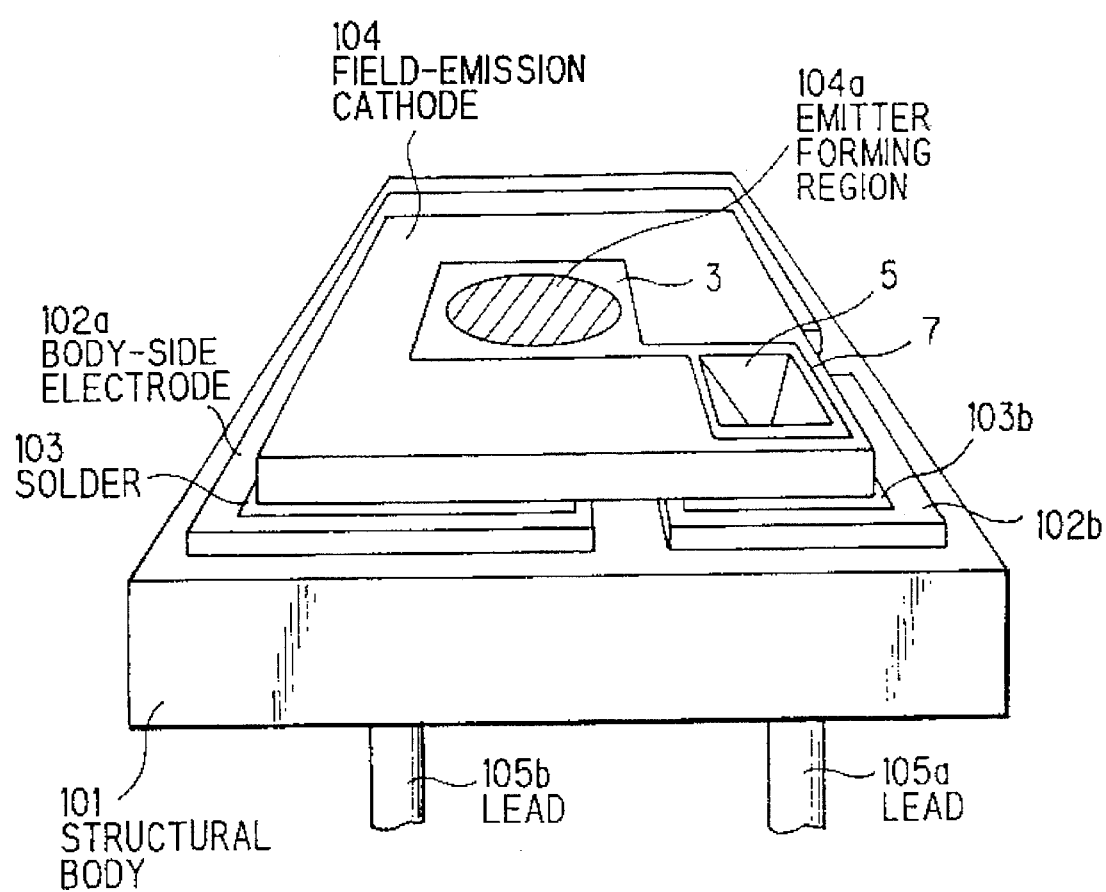
FIGS. 3A and 3B are perspective views showing examples in which field-emission cathode in the first preferred embodiment are mounted.

Before explaining a field-emission cathode and an electron tube using the same in the preferred embodiments according to the invention, the aforementioned conventional field-emission cathode will be explained.

FIG. 1 shows the conventional field-emission cathode including a silicon substrate 1, an insulating layer 2 of 1 μm thickness having a cavity 2a of 1.5 μm diameter formed on the substrate 1, a gate electrode 3 having an aperture 3a formed on the insulating layer 2, and a cone-shaped emitter 4 of molybdenum having approximately 1 μm height provided in the cavity 2a and the aperture 3a in ohmic contact with the substrate 1.

In operation, a voltage of several tens to 200 V is applied across the gate electrode 3 for a positive potential and the substrate 1 for a negative potential, so that an electric field of more than $10^7$ V/cm is generated at the tip of the emitter 4 to emit electrons therefrom.

A field-emission cathode in the first preferred embodiment according to the invention will be explained in FIG. 2.

The field-emission cathode comprises a single crystal silicon substrate 1, an insulating layer 2 of silicon oxide having cavities 2a, a gate electrode 3 of tungsten silicide having apertures 3a, cone-shaped emitters 4 of molybdenum, a contact-hole 5 provided by anisotropic etching of silicon, a first pull-out electrode 6 connected via a lead-member 7 to the gate electrode 3, and a second pull-out electrode 8 connected via the substrate 1 to the emitters 4.

In operation, a voltage of approximately 50 to 200 V is applied across the first and second pull-out electrodes 6 and 8, so that an electric field of more than $10^7$ V/cm is applied to each of the emitters 4 at the tip thereof to emit electrons therefrom.

FIG. 3A shows a first type of a structure for mounting the field-emission cathode in the first preferred embodiment thereon, wherein like parts are indicated by like reference numerals as used in FIG. 2. The first type mounting structure comprises a structural body 101 for supporting the field-emission cathode 104 having an emitter forming region 104a, and first and second body-side electrodes 102a and 102b, respectively, connected to the first and second pull-out electrodes 6 and 8 (not shown) by solders 103a and 103b, wherein the first and second pull-out electrodes 6 and 8 are connected respectively via the first and second body-side electrodes 102a and 102b to a power supply or voltage source (not shown) by leads 105a and 105b extending in the lower direction from the structural body 101.

Figure 3B:
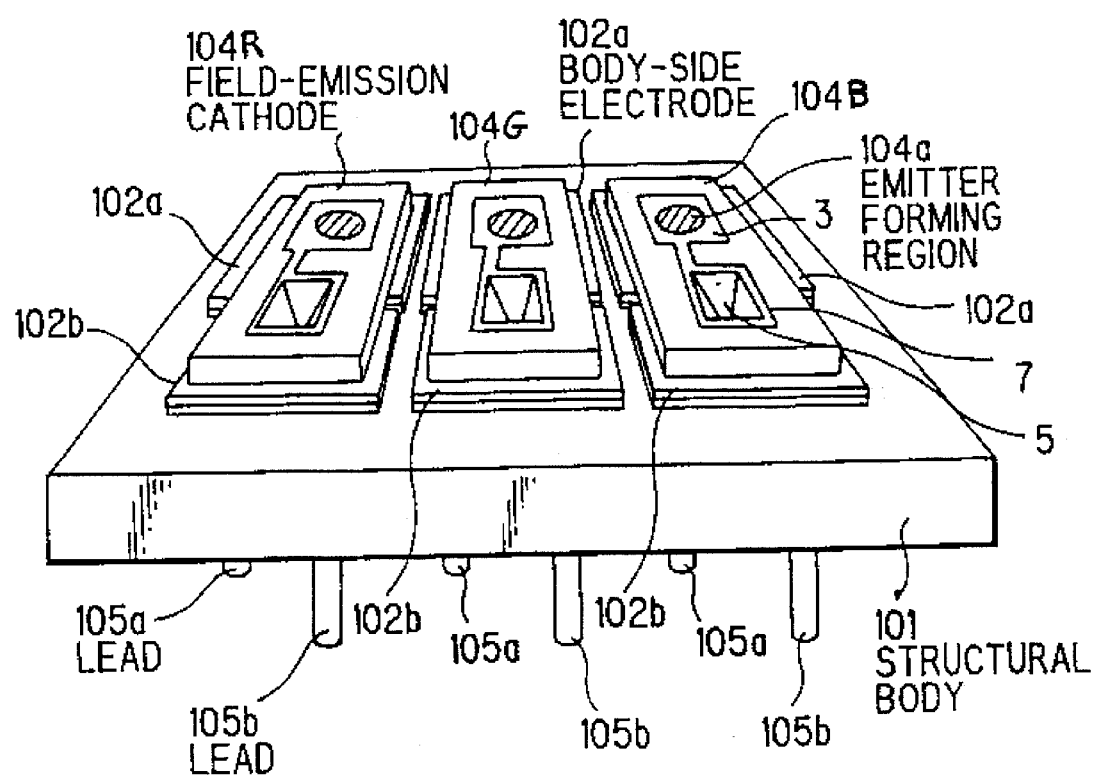

FIG. 3B shows a second type of a structure for mounting the field-emission cathodes in the first preferred embodiment, wherein like parts are indicated by like reference numerals as used in FIG. 2 and FIG. 3A. The second type mounting structure comprises a structural body 101 for supporting the field-emission cathodes 104R, 104G and 104B for red, green and blue color pixels, first body-side electrodes 102a connected to the first pull-out electrodes 6 (not shown) of the field-emission cathodes 104R, 104G and 104B, second body-side electrodes 102b connected to the second pull-out electrodes 8 (not shown) of the field-emission cathodes 104R, 104G and 104B, and leads 105a and 105b extending in the lower direction from the structural body 101 to connect the first and second pull-out electrodes 6 and 8 of the field-emission cathodes 104R, 104G and 104B to a power supply (not shown).

A method for fabricating a field-emission cathode as shown in FIG. 2 will be explained in FIGS. 4A to 4G.

In FIG. 4A, photoresist layers 41A and 41B are coated on both sides of a substrate 1, and the photoresist layer 41A is exposed to light and then cleaved to provide a pattern 41a for forming a square pyramid contact-hole, while the photoresist layer 41B is for protecting the back surface of the substrate 1 from etching.

In FIG. 4B, a square pyramid and trapezoidal contact-hole 5 is formed by anisotropic etching using alkali liquid etchant such as potassium hydroxide, etc. by the pattern 41a of the photoresist layer 41A. For instance, when a single crystal silicon of crystal orientation <100> is used for the substrate 1, a square pyramid and trapezoidal shape having a bottom plane on the top surface of the substrate 1 is formed to expose (111) plane. This etching process may be replaced by anisotropic dry etching. Alternatively, such a substrate with a contact-hole may be prepared by solidifying conductive paste or insulating paste in a mold. In using the insulating paste, the substrate must be coated with a conductive layer.

In FIG. 4C, the substrate 1 is oxidized to be coated with an insulating film 2 of silicon oxide in a thermal oxidation furnace, and a gate electrode 3 and a lead-member 7 of tungsten silicide are formed on the insulating layer 2 on the top surface of the substrate 1 and the inner surface of the contact-hole 5 by a PVD process such as sputtering, etc.

In FIG. 4D, a polysilicon layer 9 is formed on the insulating layer 2 on the back surface of the substrate 1, and a photoresist layer is formed on the polysilicon layer 9 to carry out dry etching of the insulating layer 2 and the polysilicon layer 9. Then, a first pull-out electrode 6 of Au is formed on the non-etched polysilicon layer 9, and a second pull-out electrode 8 of Au is formed on the exposed back surface of the substrate 1.

In FIG. 4E, a photoresist layer (not shown) is formed on the gate electrode 3, so that cavities 2a and apertures 3a are formed by dry etching. Then, the photoresist layer is removed as shown therein.

In FIG. 4F, aluminum is deposited in a slanting direction to form a sacrifice layer 10 only on the gate electrode 3, and molybdenum is vertically deposited to form emitters 4 in the cavities 2a and the apertures 3a.

In FIG. 4G, the sacrifice layer 10 is dissolved by liquid etchant such as thermal phosphoric acid-water solution, etc., and the molybdenum layer 10 is removed to provide the field-emission cathode as shown in FIG. 2.

Figure 5:
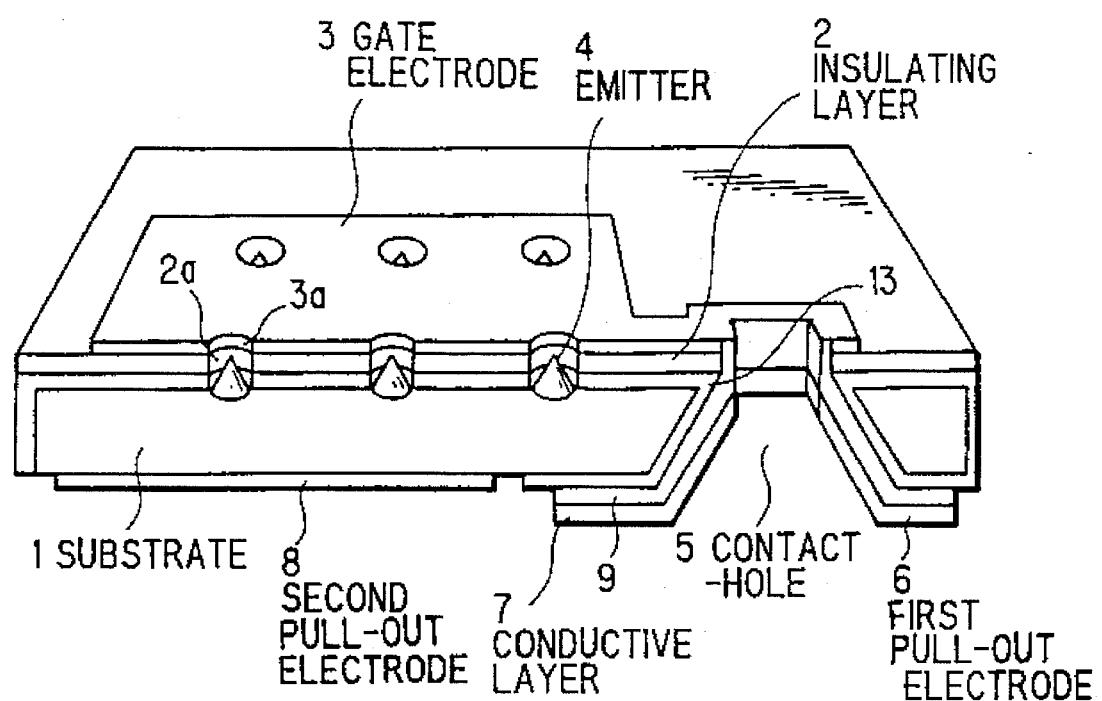
FIG. 5 is a perspective and cross-sectional view showing a field-emission cathode in a second preferred embodiment according to the invention.

FIG. 5 shows a field-emission cathode in the second preferred embodiment, wherein like parts are indicated by like reference numerals as used in the first preferred embodiment.

In the second preferred embodiment, each of the emitters 4 is a part of the silicon substrate 1, and the contact-hole 5 is formed from the back surface of the silicon substrate 1. In addition, a silicon oxide layer 13 is formed between the silicon substrate 1 and the silicon oxide layer 2.

FIGS. 6A to 6F show a method for fabricating a field-emission cathode as shown in FIG. 5.

Figure 6A:
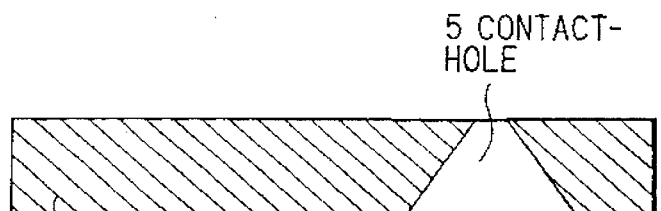
FIGS. 6A to 6F are cross-sectional views showing how a field-emission cathode in the second preferred embodiment is fabricated.

In FIG. 6A, a photoresist layer (not shown) is formed on the back surface of a silicon substrate 1, and a protective layer (not shown) is formed on the top surface of the silicon substrate 1. Then, a square pyramid and trapezoidal contact-hole 5 is formed from the back surface of the substrate 1 by liquid etchant such s potassium hydroxide, etc.

Figure 6B:
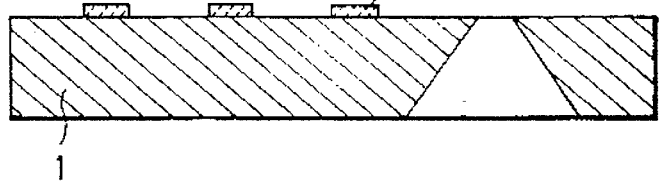

In FIG. 6B, a silicon nitride layer is formed on the substrate 1, and a photoresist layer is formed on the silicon nitride layer. Then, dry etching is carried out to provide circular silicon nitride layers 12 on the substrate 1.

Figure 6C:
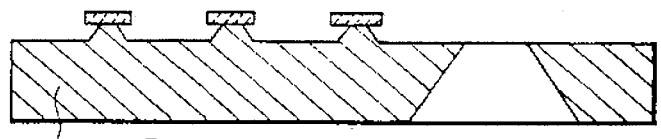

In FIG. 6C, anisotropic and isotropic etchings are carried out by using the circular silicon nitride layers 12 as a mask, so that emitters 4, each of which is a part of the silicon substrate 1, are formed below the circular silicon nitride layers 12.

Figure 6D:
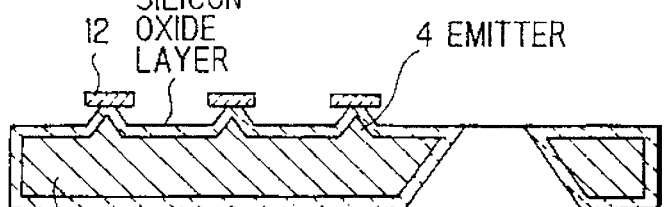

In FIG. 6D, the silicon substrate 1 having the emitters is thermally oxidized in a thermal oxidation furnace to sharpen tips of the emitters 4. At this time, a silicon oxide layer 13 is formed on the substrate.

Figure 6E:
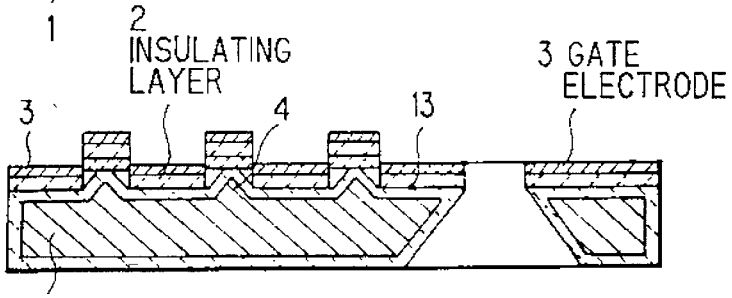

In FIG. 6E, an insulating layer 2 of silicon nitride, etc. is formed by a CVD process, and a gate electrode 3 of tungsten silicide is formed by a PVD process such as sputtering, etc.

Figure 6F:
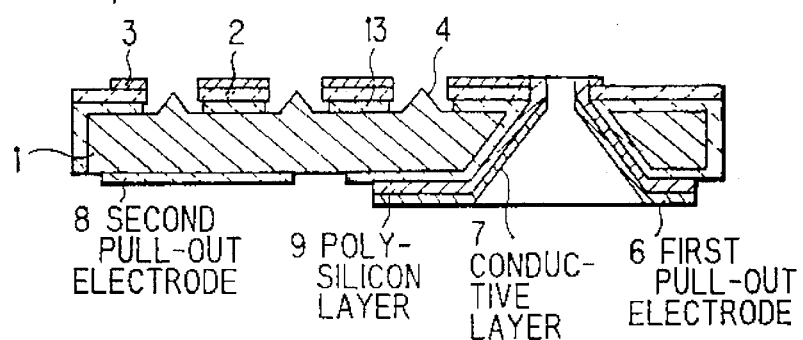

In FIG. 6F, a polysilicon layer is formed on the back surface of the substrate 1 by a CVD process, and dry etching is carried out to provide a patterned polysilicon layer 9 by using a photoresist layer (not shown) which will be removed thereafter. Then, a first pull-out electrode 6 and a second pull-out electrode 8 of Au are formed to complete the field-emission cathode as shown in FIG. 5. In removing unnecessary portions of the insulating layer at this step, the silicon oxide layers 13 on the emitters are removed, so that the insulating layers 2 and the gate electrodes 3 on the emitters are removed therefrom. A polysilicon layer on the inner side wall of the contact hole 5 will be a lead member 7 to connect the gate electrode 3 to the first pull-out electrode 6.

Figure 7A:
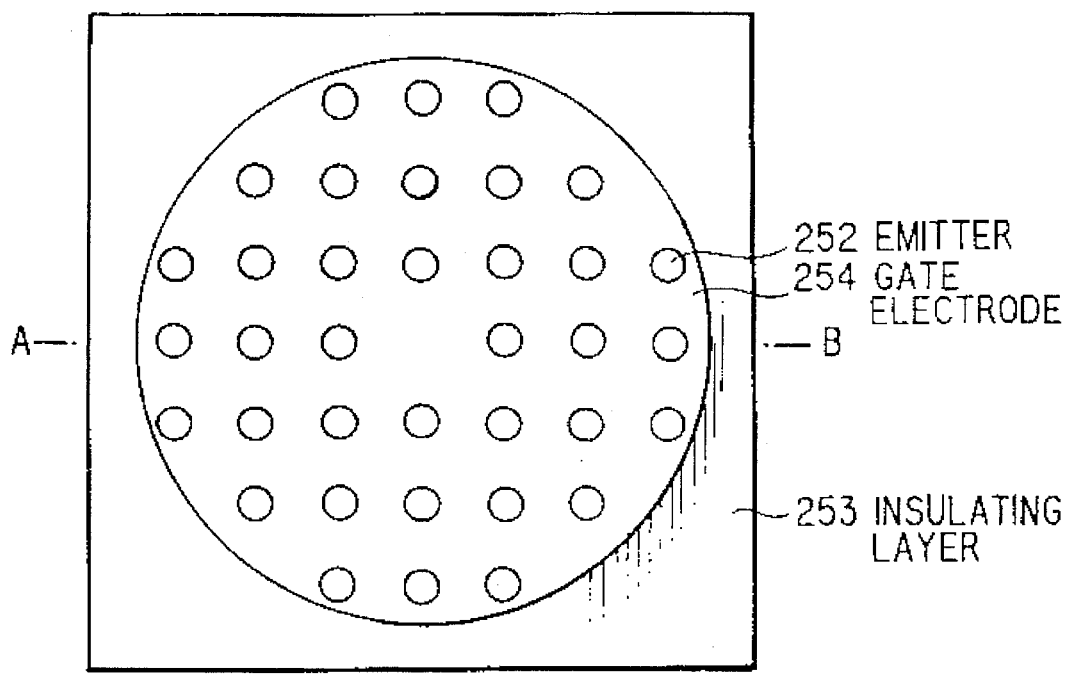
FIGS. 7A and 7B, FIGS. 8A and 8B, FIGS. 9A and 9B, and FIGS. 10A and 10B are plan views and cross-sectional views showing field-emission cathodes in third to sixth preferred embodiments according to the invention.
Figure 7B:
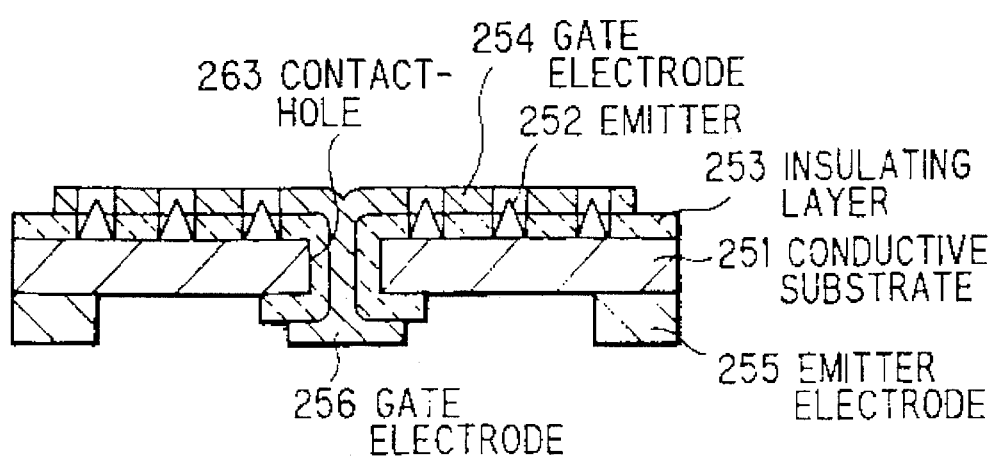

FIGS. 7A and 7B show a field-emission cathode in the third preferred embodiment according to the invention. In the field-emission cathode, fine cone-shaped emitters 252 are provided on a conductive substrate 251, and an insulating layer 253 and a gate electrode 254 both having cavities surrounding the emitters 252 are formed on the substrate 251. A contact-hole 263 is provided through the central portion of the substrate 251. The gate electrode 254 extends from the top surface of the substrate 251 through the contact-hole 263 along with the insulating layer 253 to the back surface of the substrate 25 to provide a gate electrode 256 for a first pull-out electrode, and an emitter electrode 261 for a second pull-out electrode is provided on the back surface of the substrate 1.

In the field-emission cathode, positive ions collide with the gate electrode 256, where there are not provided apertures of the gate electrode 254 and the emitters 252 which are sensitive to impact of ions. As a result, there is less possibility to result in the change of characteristics and the deterioration of insulation. Further, there are less mechanical and thermal influences on the emitters 252, the insulating layer 253, and the gate electrode 254, even if the positive ions collide with the gate electrode 256.

Figure 8A:
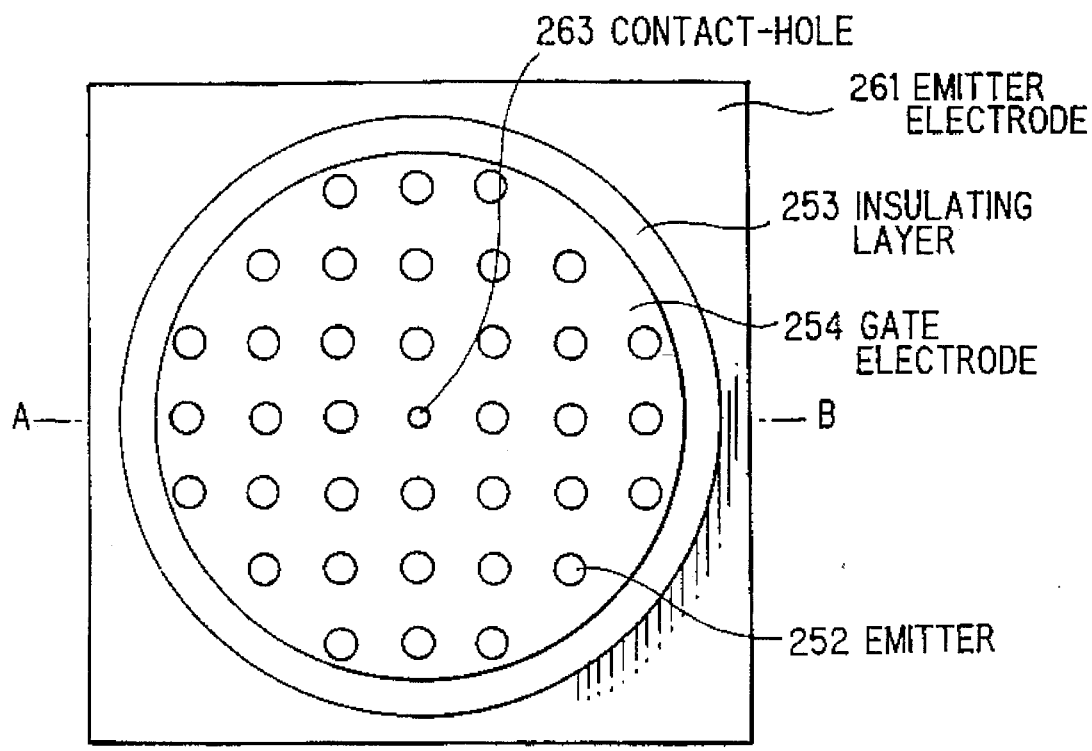
Figure 8B:
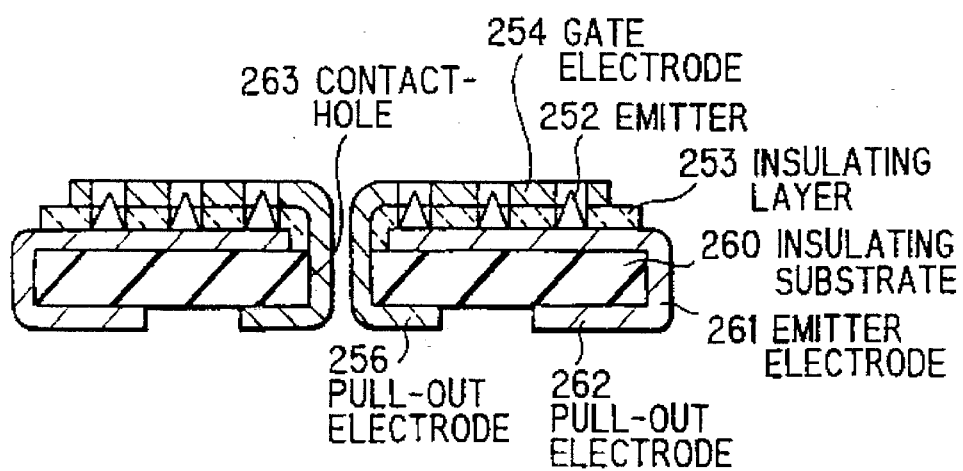

FIGS. 8A and 8B show a field-emission cathode in the fourth preferred embodiment according to the invention, wherein like parts are indicated by like reference numerals as used in the third preferred embodiment.

In the fourth preferred embodiment, an insulating substrate 260 is used in place of the conductive substrate 251, and a thin conductive film for the emitter electrode 261 is provided on the insulating substrate 260 except for the central portion thereof. On the emitter electrode 261 on the top surface of the insulating substrate 260, the emitters 252 are provided in the cavities of the insulating layer 253 and the gate electrode 254. The end portions 256 and 262 of the gate electrode 254 and the emitter electrode 261 are positioned on the back surface of the insulating substrate 260 for the first and second pull-out electrodes to be connected to a power supply (not shown).

In the fourth preferred embodiment, positive ions pass through the contact-hole 263 to collide with a structural body (not shown) which is positioned under the insulating substrate 260, or to collide with a portion of the gate electrode 254 which is adjacent to the contact-hole 263. The emitters 252 and apertures of the gate electrode 254 which are sensitive to ion-impact are not positioned near the ion-colliding area. As a result, no deterioration of insulation and no change of characteristics occur in the field-emission cathode. Further, no thermal and mechanical influence is applied to the emitters 252, the insulating layer 253 and the gate electrode 254.

Figure 9A:
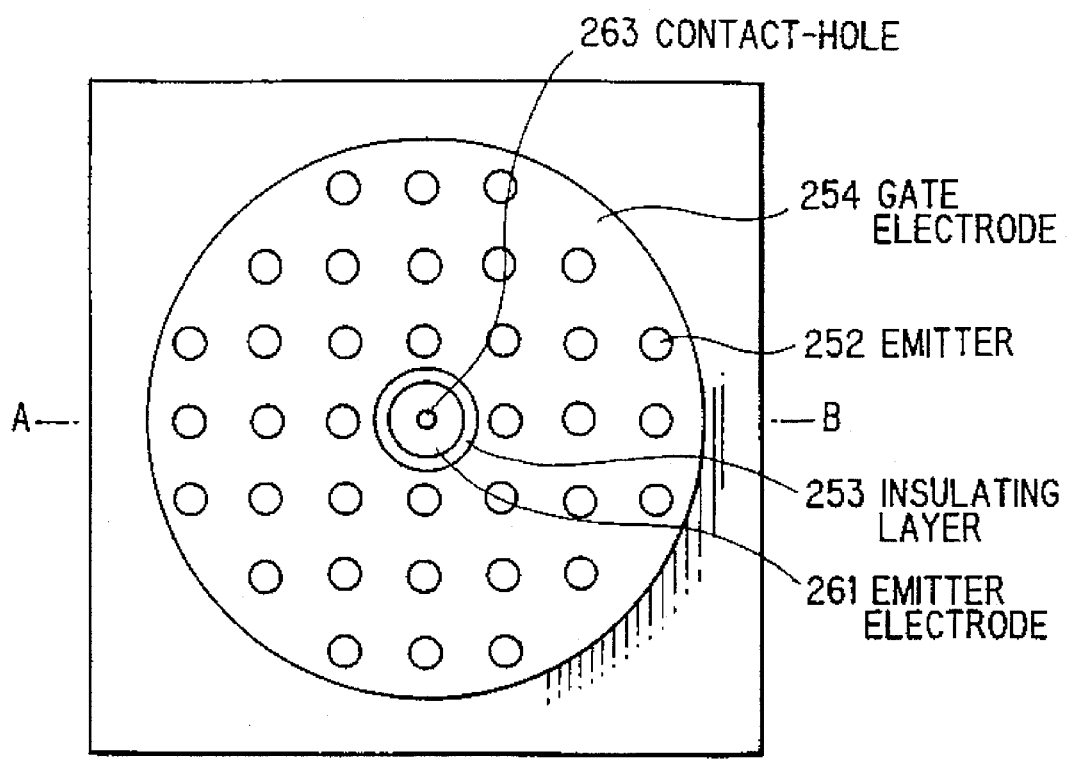
Figure 9B:
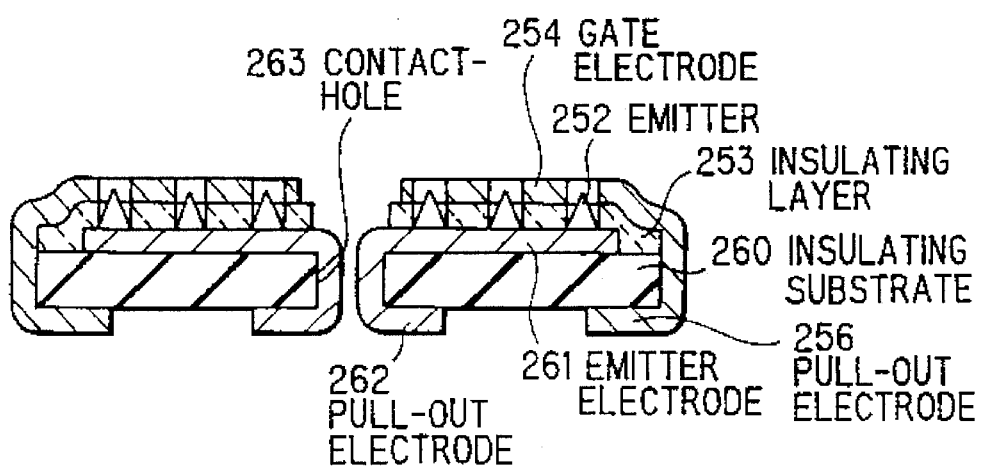

FIGS. 9A and 9B show a field-emission cathode in the fifth preferred embodiment according to the invention, wherein like parts are indicated by like reference numerals as used in the fourth preferred embodiment.

In the fifth preferred embodiment, the emitter electrode 261 extends through the contact-hole 263 to be positioned on the back surface of the insulating substrate 260 for the second pull-out electrode 262, and the gate electrode 254 extends on the side of the insulating substrate 260 to be positioned on the back surface thereof for the first pull-out electrode 256.

Figure 10A:
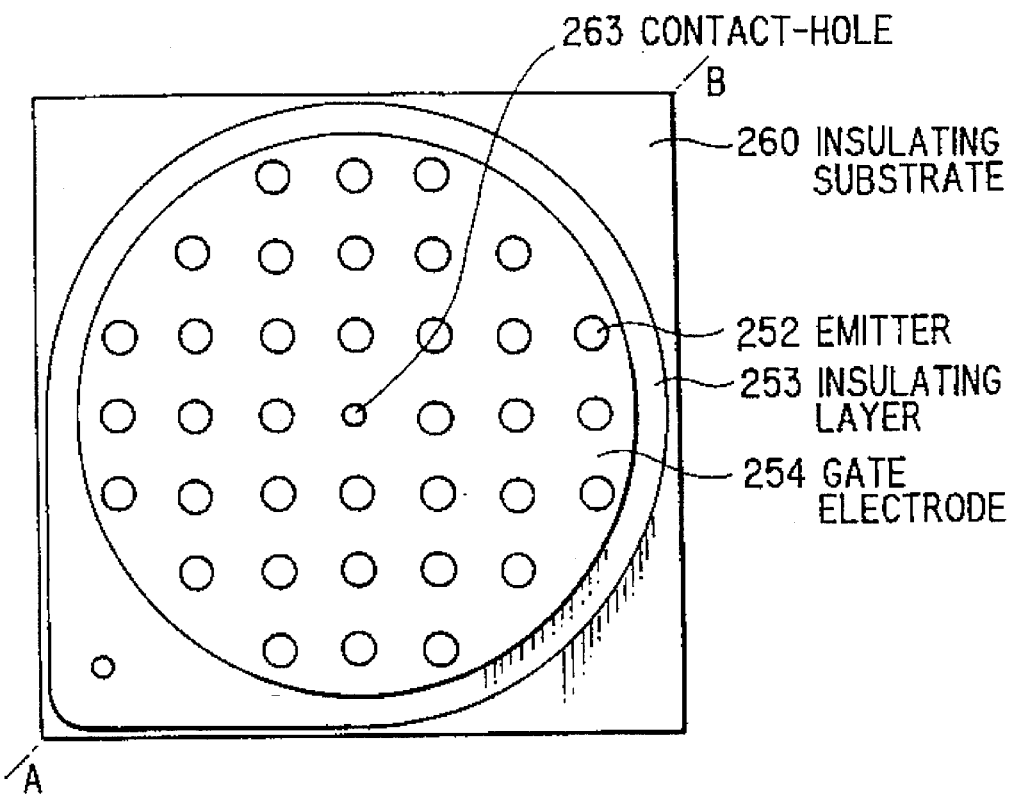
Figure 10B:
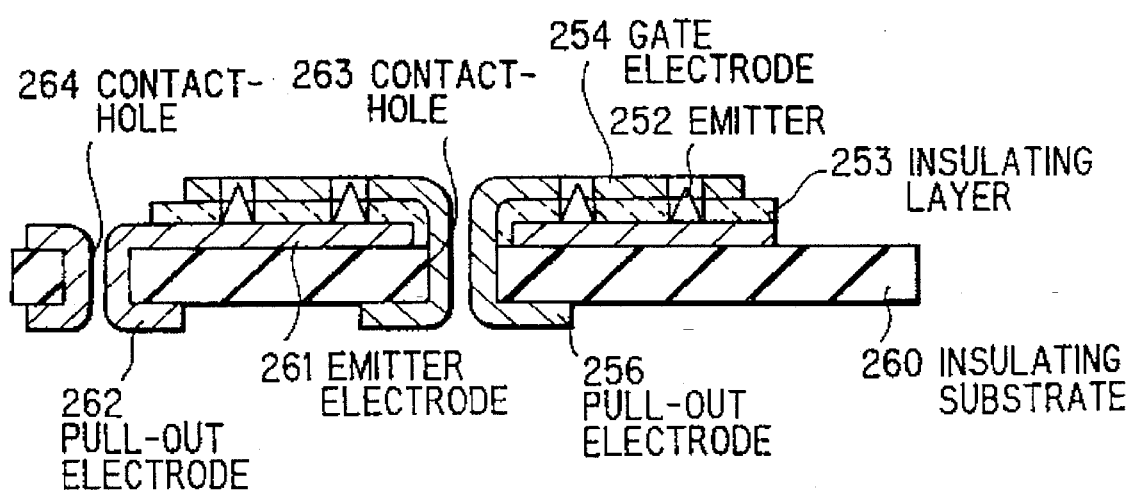

FIGS. 10A and 10B show a field-emission cathode in the sixth preferred embodiment according to the invention, wherein like parts are indicated by like reference numerals as used in the fourth preferred embodiment.

In the sixth preferred embodiment, the insulating substrate 260 is provided with a contact-hole 264 through which the emitter electrode 261 passes to be positioned on the back surface of the insulating substrate 260 for the second pull-out electrode 262.

In the third to sixth preferred embodiments, the contact-hole 263 is provided in an area on which positive ions collide. Thus, the ion-impact influence is avoided, while the gate and emitter electrodes are pulled onto the back surface of the conductive or insulating substrate. That is, an ion-colliding area is positively utilized in the preferred embodiments, while the Japanese Patent Application No. 4-80146 (Japanese Patent KoKai No. 5-307930) proposes the structure in which no formation of electrodes is adopted in an ion-colliding area.

In the fourth and fifth preferred embodiments, the gate and emitter electrodes 256 and 261 may extend on the whole side surface or limited portions of the side surface of the substrate.

In the invention, the contact-hole is provided entirely through the substrate. For this structure, it is different from contact-holes for the connection of multiple-conductive layers formed on a substrate as disclosed in the Japanese Patent Kokai Nos. 3-104260 and 2-301142, etc.

The Japanese Patent Kokai No. 59-132149 discloses a through-hole which is provide through a dielectric substrate, wherein a metallized film is deposited on an inner surface of the through-hole for a super-high frequency transistor device. However, this does not suggest an insulation between a conductive thin film and an inner wall of a substrate in the invention.

Figure 11:
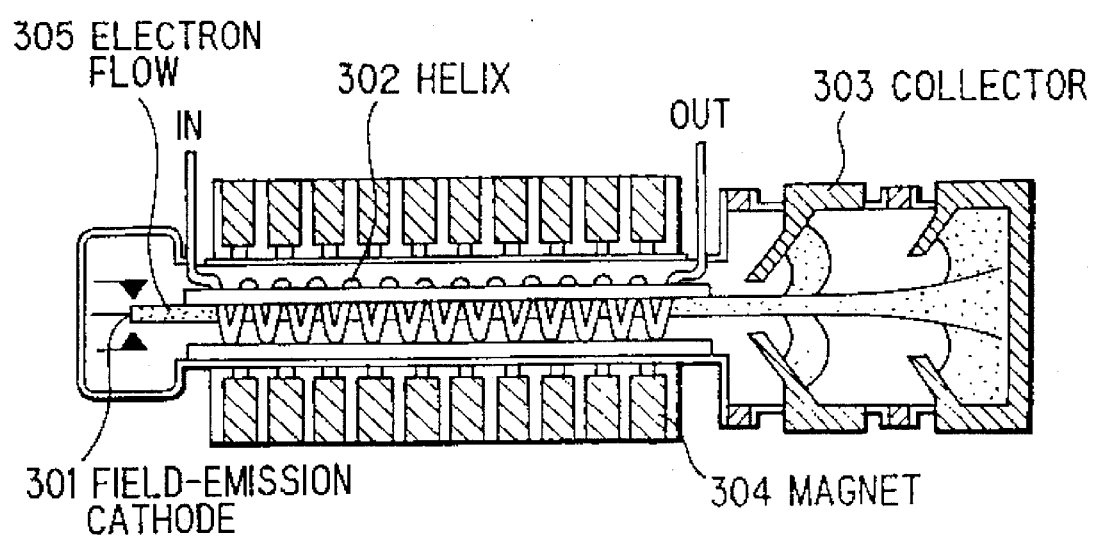
FIG. 11 is a cross-sectional view showing a traveling-wave tube using a field-emission cathode in a preferred embodiment according to the invention.

FIG. 11 shows an electron tube using a field-emission cathode which is a traveling-wave tube in the first preferred embodiment according to the invention.

The traveling-wave tube comprises a field-emission cathode 301 for emitting electrons, a helix 302 through which a signal flows, a collector 303 for collecting the electrons, and a permanent magnet 304 which is provided around the helix 302 to focus electrons. The field-emission cathode 301 is one of the field-emission cathodes in the first to sixth preferred embodiments.

In operation, electrons 305 which are emitted from the field-emission cathode 301 flow through a path defined in the helix 302 to be collected by the collector 303. A signal supplied to the input terminal IN of the helix 302 interacts with the flow of the electrons 305, to become an amplified signal that is obtained at the output terminal OUT of the helix 302.

Although the invention has been described with respect to specific embodiment for complete and clear disclosure, the appended claims are not to be thus limited but are to be construed as embodying all modifications and alternative constructions that may occur to one skilled in the art which fairly fall within the basic teaching herein set forth.

What is claimed is:

1. A field-emission cathode, comprising:

a conductive substrate having first and second surfaces;

a gate electrode provided on said first surface of said substrate and having one or more apertures;

an insulation film disposed between said gate electrode and said substrate;

one or more emitters provided on said first surface of said substrate, said emitters having sharpened tips extending into said apertures of said gate electrode;

a contact-hole extending through said conductive substrate and having an inner wall;

a power supply electrode provided on said second surface of said substrate and insulated from said substrate;

a conductive member extending through said contact-hole and connecting said gate electrode to said power supply electrode through said contact-hole; and an insulating layer provided between said conductive member and said conductive substrate.

2. The cathode as defined in claim 1, wherein:

said substrate is a single crystal silicon substrate;

said contact-hole is formed in said single crystal silicon substrate by anisotropic etching, whereby said contact-hole is of a multi-angle pyramid and trapezoidal shape; and said conductive member is a thin conductive film which is provided on an insulated surface of said contact-hole.

3. The cathode as defined in claim 1, wherein:

said emitters are arranged in a predetermined pattern; and said substrate is provide with said contact-hole at a central position of an electron emission region comprising a plurality of electrodes each having a tip portion.

4. The cathode as defined in claim 1, further comprising:

a further contact-hole provided through said substrate;

a further power supply electrode provide on said second surface of said substrate; and a conductive member provided on an inner wall of said further contact-hole to connect said emitters to said further power supply electrode.

5. An electron tube, comprising:

an electron emission source for emitting electrons; and a unit for collecting the electrons emitted from said source via an electron path;

wherein said source comprises:

a conductive substrate having a first surface and a second surface;

a gate electrode provided on said first surface of said conductive substrate;

an insulation film between said gate electrode and said substrate;

one or more apertures formed in said gate electrode;

one or more emitters provided on said first surface of said conductive substrate, said emitters having sharpened tips extending into said apertures of said gate electrode;

a contact-hole extending through said conductive substrate;

a power supply electrode provided on said second surface of said conductive substrate and insulated from said conductive substrate;

a conductive member provided on an inner wall of said contact-hole and connecting said gate electrode to said power supply electrode through said contact-hole; and an insulating layer disposed between said conductive member and said conductive substrate.

6. The electron tube as defined in claim 5, wherein:

said substrate is a single crystal silicon substrate;

said contact-hole is formed in said single crystal silicon substrate by anisotropic etching, whereby said contact-hole is of a multi-angle pyramid and trapezoidal shape; and said conductive member is a thin conductive film which is provided on an insulated surface of said contact-hole.

7. The electron tube as defined in claim 5, wherein:

said emitters are arranged in a predetermined pattern; and said substrate is provide with said contact-hole at a central position of an electron emission region comprising a plurality of electrodes each having a top portion.

8. The electron tube as defined in claim 5, wherein said source, further comprising:
- a further contact-hole provided through said substrate;
- a further power supply electrode provided on said second surface of said substrate; and
- a conductive member provided on an inner wall of said further contact-hole to connect said emitters to said further power supply electrode.

* * * * *